(12) United States Patent
Moon et al.

(10) Patent No.: US 7,751,203 B2
(45) Date of Patent: Jul. 6, 2010

(54) IMAGE DISPLAY APPARATUS

(75) Inventors: Hyoung Gun Moon, Daegu-si (KR); Deok Soo Kim, Gumi-si (KR); Jun Hee Kong, Gumi-si (KR); Tae Hwa Hwang, Gumi-si (KR); Jong Yoon Keum, Busan-si (KR); Geun Soo Lim, Sungnam-si (KR); Yong Song, Gumi-si (KR)

(73) Assignee: LG Electronics Inc., Seoul (KR)

( * ) Notice: Subject to any disclaimer, the term of this patent is extended or adjusted under 35 U.S.C. 154(b) by 727 days.

(21) Appl. No.: 11/619,224

(22) Filed: Jan. 3, 2007

(65) Prior Publication Data
US 2007/0195219 A1 Aug. 23, 2007

(30) Foreign Application Priority Data

Feb. 20, 2006 (KR) .................. 10-2006-0016297
Feb. 23, 2006 (KR) .................. 10-2006-0017562
Mar. 8, 2006 (KR) .................. 10-2006-0021831

(51) Int. Cl.
*H05K 7/14* (2006.01)
*H05K 7/20* (2006.01)

(52) U.S. Cl. ................. 361/809; 361/807; 361/707; 361/816

(58) Field of Classification Search ............ 361/702, 361/704, 753, 799, 800, 807, 816, 818, 707, 361/809; 174/520
See application file for complete search history.

(56) References Cited

U.S. PATENT DOCUMENTS

| 6,946,798 | B2* | 9/2005 | Kawaguchi et al. | 315/85 |
|---|---|---|---|---|
| 7,084,568 | B2* | 8/2006 | Kim | 313/582 |
| 7,164,586 | B2* | 1/2007 | Lin | 361/714 |
| 7,457,120 | B2* | 11/2008 | Bae et al. | 361/704 |
| 7,505,270 | B2* | 3/2009 | Kim | 361/704 |
| 2002/0067591 | A1 | 6/2002 | Tajima | |
| 2005/0117304 | A1 | 6/2005 | Kim | |

FOREIGN PATENT DOCUMENTS

| EP | 0 910 107 | 4/1999 |
|---|---|---|
| EP | 1 378 926 | 1/2004 |
| EP | 1 494 467 | 1/2005 |

OTHER PUBLICATIONS

European Search Report dated Jun. 6, 2007, Application No. 06025968.6 (8 pages).

* cited by examiner

*Primary Examiner*—Dameon E Levi
(74) *Attorney, Agent, or Firm*—Fish & Richardson P.C.

(57) ABSTRACT

An image display apparatus is provided. At least one heat radiating frame is stacked in a heat radiating frame coupled between a circuit board and a panel, a heat radiating frame to which the circuit board is fixed can secure a space by a height of a protruded part as the protruded part is formed by drawing the frame itself, and thus fastening means for fixing the circuit board without a PEM nut can be fastened, and as a sound absorbing material is filled within a protruded part formed in a heat radiating frame opposite to the panel, vibration noise generating when driving the panel can be reduced.

15 Claims, 11 Drawing Sheets

IMAGE DISPLAY APPARATUS

This Nonprovisional application claims priority under 35 U.S.C. §119(a) on Patent Application No. 10-2006-0016297 filed in Korea on Feb. 20, 2006, Patent Application No. 10-2006-0017562 filed in Korea on Feb. 23, 2006 and Patent Application No. 10-2006-0021831 filed in Korea on Mar. 8, 2006, the entire contents of which are hereby incorporated by reference.

BACKGROUND

1. Field

This document relates to an image display apparatus including a plasma display apparatus, and more particularly, to a structure of a heat radiating frame that is positioned at the rear side of a panel.

At least one protruded part is formed in the heat radiating frame to stably fix a circuit board, and a sound absorbing material is filled in a space between the panel and the heat radiating frame to reduce vibration and noise.

2. Background

In a plasma display panel, a discharge cell is formed between a rear substrate in which barrier ribs are formed and a front substrate opposite thereto and vacuum ultraviolet rays generating when an inert gas within each discharge cell is discharged by a high frequency of voltage allows a phosphor to emit light, thereby embodying an image.

FIG. 1 is a perspective view of a plasma display apparatus in a related art.

As shown in FIG. 1, a conventional plasma display panel includes a panel 3 that includes a front and rear substrates and that generates light by performing a discharge by the applied pulse, a heat radiating frame 4 that is provided in the rear side of the panel 3 to emit heat generating from the panel 3, a filter 2 that is provided in the front side of the panel 3 to intercept electromagnetic interference (hereinafter, referred to as "EMI") and to prevent external reflection, and a cabinet 1 that is combined with a rear cover while surrounding a part of an edge of the filter 2.

Particularly, a plurality of fastening holes for fastening a circuit board coupled to the rear side is formed in the heat radiating frame 4.

FIG. 2 is a rear view of a heat radiating frame in a related art, where the panel 3 is coupled to the front of the heat radiating frame as shown in FIG. 1 and a plurality of circuit boards is coupled to the rear thereof.

The circuit boards 5 to 8 include an address, scan, and sustain substrates for applying a pulse to an electrode provided in the panel, a controller substrate for controlling switching timing in the address, scan, and sustain substrates, and a power substrate for supplying power to each of the substrates.

Particularly, the address, scan, and sustain substrates are connected to the electrode provided in the panel through a flexible printed circuit 9 (hereinafter, referred to as "FPC") and are connected to the controller substrate by a cable 10.

Referring to FIG. 3, in a coupling structure of a heat radiating frame and a circuit board in the related art, a hole is formed in the heat radiating frame 4 and thus a PEM nut 12 is inserted toward the rear side, and the heat radiating frame and the PEM nut 12 are coupled by a press. Thereafter, as fastening means 13 is penetrated through the hole formed in the circuit board 5, the fastening means 13 is fastened to the PEM nut 12 coupled to the heat radiating frame 4.

Circuit constituent elements such as a switching element are mounted in a plurality of circuit boards 5 to 8 coupled to the heat radiating frame 4, thereby generating much heat. Accordingly, the PEM nut 12 is used to separate the heat radiating frame 4 and the circuit boards 5 to 8 by a predetermined distance. However, because a PEM nut having a different size should be fastened in one heat radiating frame depending on a coupling position or a hole size, it is general that a insertion and fastening processes are manually performed, whereby there is a problem that an assembling cost rises and a defective proportion increases due to erroneous insertion.

Furthermore, there is a problem that vibration noise due to driving of a panel is generated in a separating space between the heat radiating frame 4 and the panel 3.

SUMMARY

The present invention has been made in view of the above problems occurring in the prior art, and it is an object of the present invention to provide a image display apparatus including: a panel; a heat radiating frame that is positioned at the rear side of the panel; at least one circuit board that is positioned at the rear side of the heat radiating frame, wherein at least one protruded part protruded by drawing a frame itself is provided in one surface or both surfaces of the heat radiating frame and at least one hole that penetrates fastening means for fastening the circuit board is formed in the protruded part.

Furthermore, as at least two heat radiating frames are stacked, heat radiating efficiency of the heat radiating frame improves. A protruded part may be formed in only one surface or in each of both surfaces of a first heat radiating frame opposite to the circuit board among them, and a protruded part may be formed in only one surface of a second heat radiating frame opposite to the panel and may be a flat type.

A fixed part for fixing fastening means that penetrates a hole is inserted into a protruded part opposite to the panel.

The protruded part is formed in plural, and a height of at least one of the plurality of protruded parts is different from that of the remaining protruded parts. A height of the protruded part is in proportional to a heating value of the coupled circuit boards.

The protruded part may have a section of a trapezoidal shape in which a length of a base is longer than that of an upper base, or a quadrangular shape, or a bell shape.

Furthermore, a sound absorbing material is filled within at least one protruded part of a heat radiating frame opposite to the panel to reduce vibration noise generating in a space between the heat radiating frame and the panel.

BRIEF DESCRIPTION OF THE DRAWING

The embodiment of the invention will be described in detail with reference to the following drawings in which like numerals refer to like elements.

DETAILED DESCRIPTION OF THE PREFERRED EMBODIMENT

Hereinafter, an embodiment of the present invention will be described in detail with reference to FIGS. 4 to 15. A heat radiating frame according to an embodiment of the present invention can be applied to most image display apparatuses, but in the present embodiment, the heat radiating frame can be applied to a plasma display apparatus.

Figure 4:
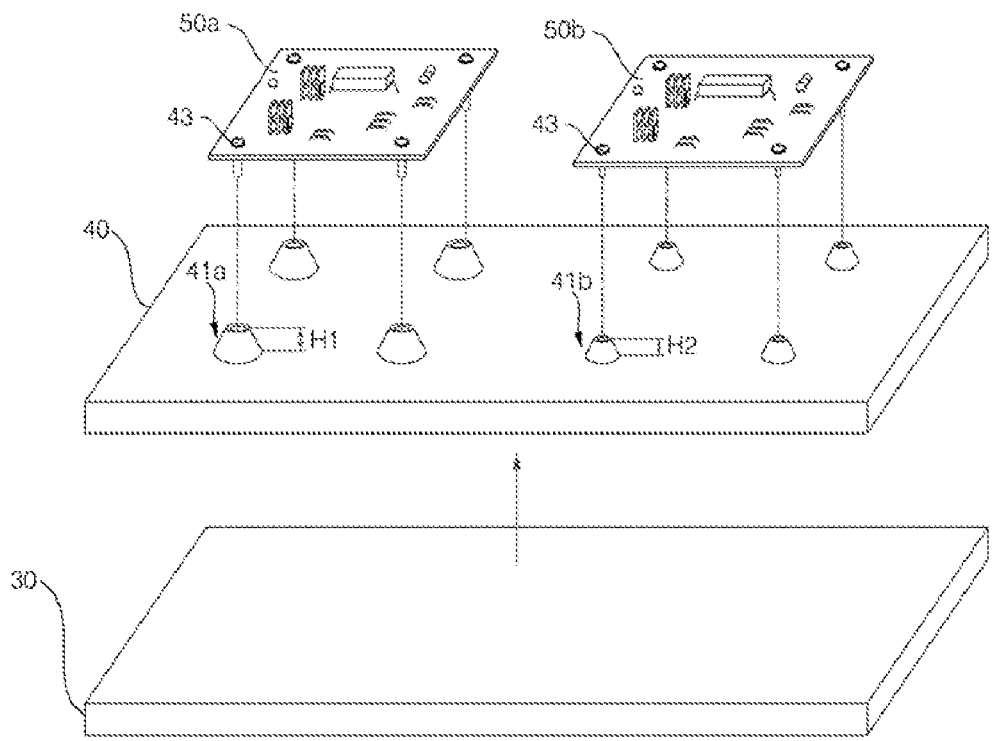
FIG. 4 is a perspective view of a heat radiating frame according to a first embodiment of the present invention.
Figure 5:
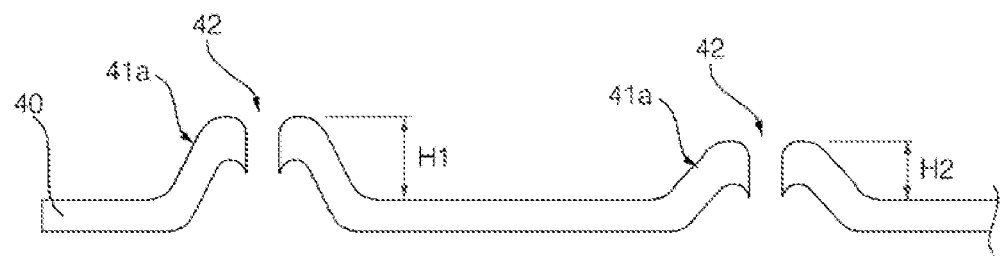
FIG. 5 is a cross-sectional view of a heat radiating frame according to a first embodiment of the present invention.

FIG. 4 is a perspective view of a heat radiating frame and a circuit board coupled thereto according to a first embodiment of the present invention and FIG. 5 is a cross-sectional view of a heat radiating frame according to a first embodiment of the present invention.

First, the panel 30 includes a front substrate in which a scan electrode and a sustain electrode are provided and a rear substrate that is coupled to the front substrate at the rear side of the front substrate and in which an address electrode is provided. Furthermore, an inert mixed gas is filled within a space between the front substrate and the rear substrate and a heat radiating frame 40 for emitting heat generating in the panel is provided in the rear surface of the panel 30.

Furthermore, circuit boards 50*a* and 50*b* provided in the rear side of the heat radiating frame 40 include a scan substrate and a sustain substrate for applying a pulse to the scan electrode and the sustain electrode, an address substrate for applying a pulse to the address electrode, a controller substrate for controlling switching operation timing in the scan, sustain, and address substrates, and a power substrate for supplying power to each the substrates.

The number and kind of the circuit boards 50*a* and 50*b* provided at the rear side of the heat radiating frame 40 are not limited by those shown in the figures.

Figure 1:
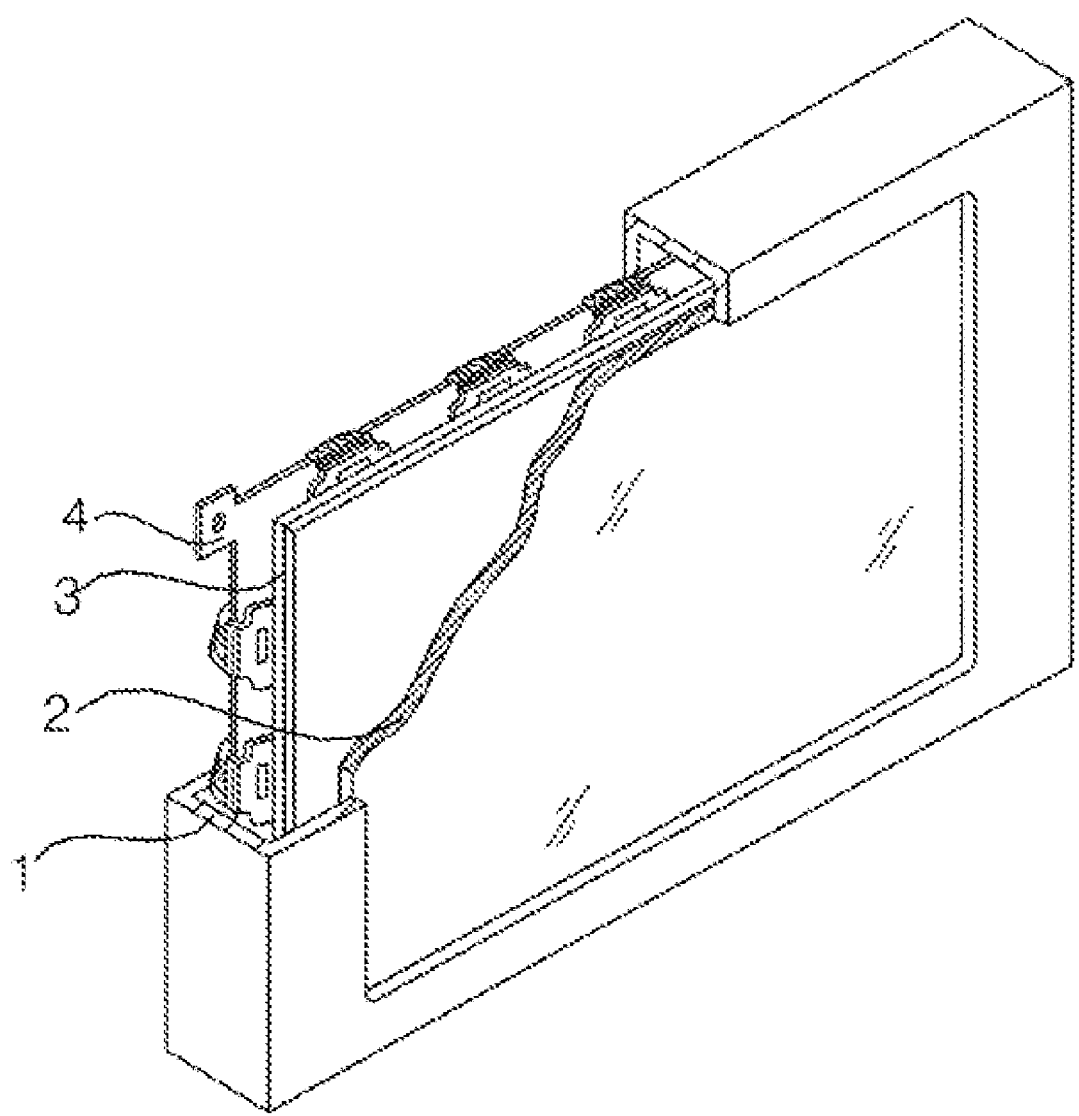
FIG. 1 is a perspective view of a plasma display apparatus in a related art.
Figure 2:
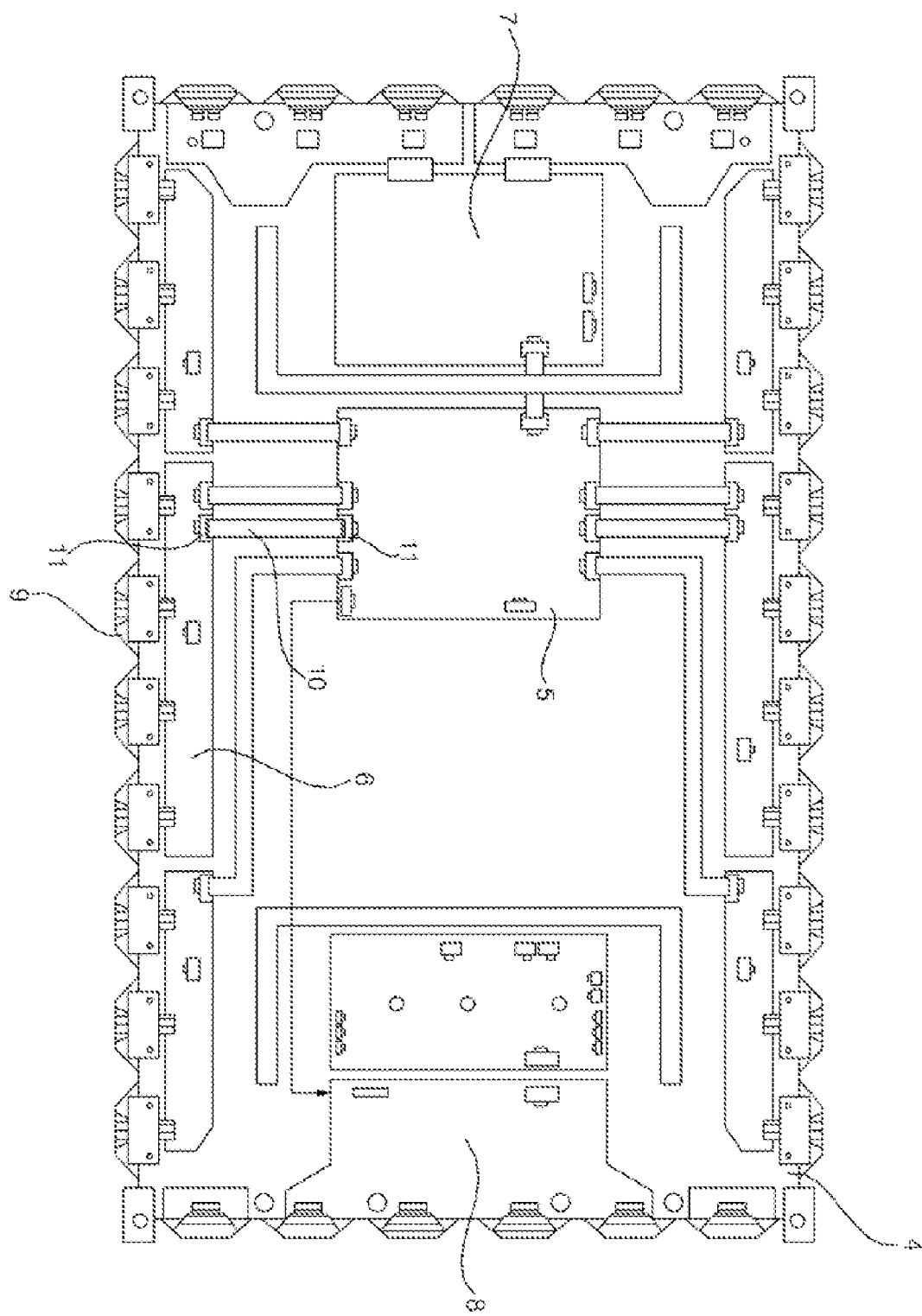
FIG. 2 is a rear view of a heat radiating frame in a related art.
Figure 3:
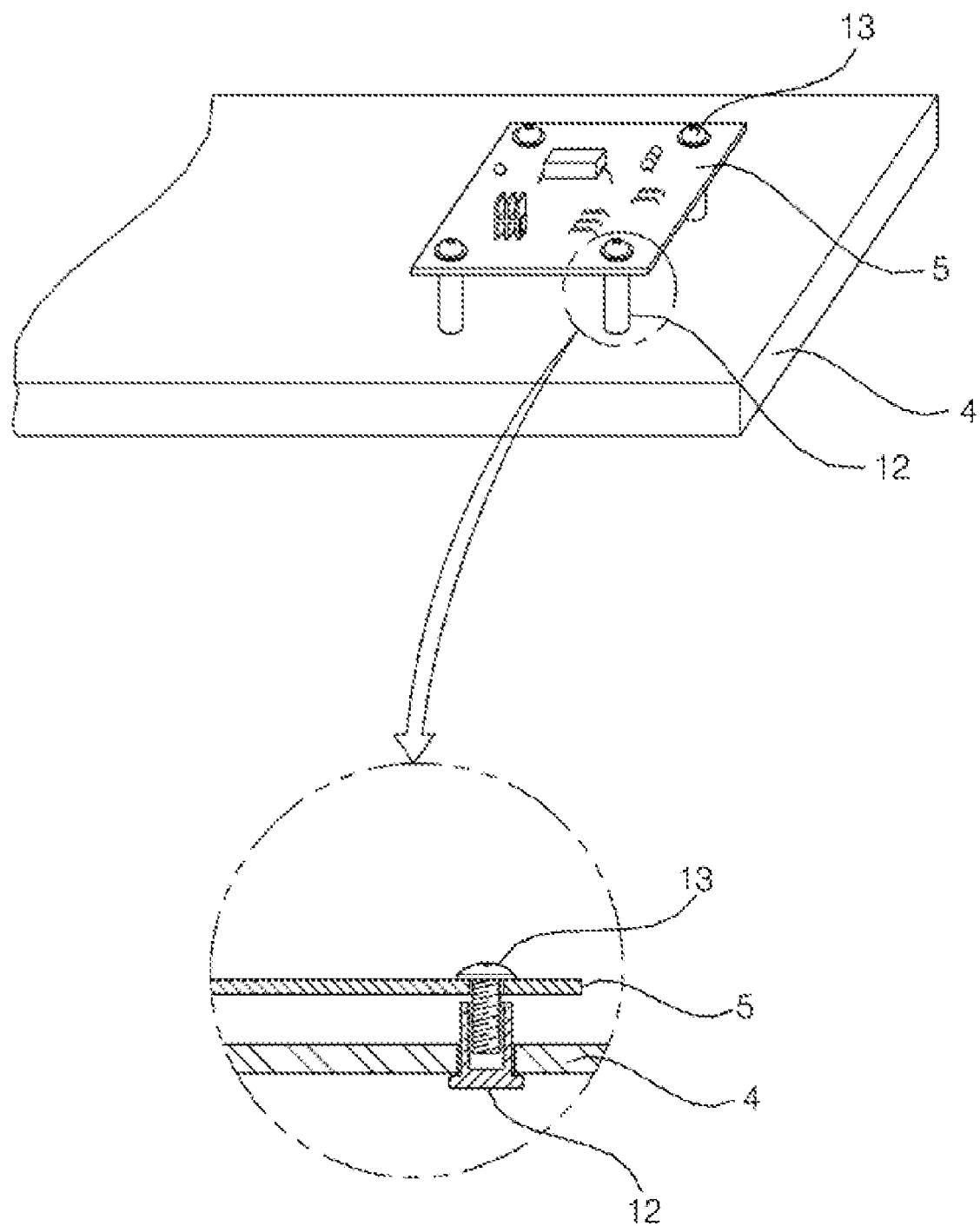
FIG. 3 is a perspective view of a heat radiating frame and a circuit board coupled thereto in a related art.

The panel 30 and the respective electrodes are connected to each other through a flexible printed circuit (hereinafter, referred to as "FPC"), and the address, scan, sustain substrates and the control substrate are connected to each other through a cable, as shown in FIG. 2.

The FPC is a circuit provided within a flexible film and is illustrated in the present embodiment, but the present embodiment is not limited to the FPC, but may use a chip on film type, a tape carrier package type, etc.

Each of the circuit boards 50*a* and 50*b* includes both sides of a component side in which circuit constituent components, etc. are mounted and a solder side in which soldering is performed so as to fix the components to the substrate, and the solder side is opposite to the heat radiating frame 40.

Because different circuit constituent components are mounted in each of the circuit boards 50*a* and 50*b*, a heating value is also different. A height of the circuit board is also different depending on a degree of soldering.

As the heat radiating frame 40 to which at least one circuit board 50*a* and 50*b* is coupled is firstly or secondary pressurized toward the rear from the front, at least one protruded part 41*a* and 41*b* protruded to the rear side by drawing is formed. That is, protruded parts 41*a* and 41*b* according to an embodiment of the present invention are formed as the radiating frame itself is bent by drawing.

A hole 42 formed in the protruded parts 41*a* and 41*b* is formed by punching toward the front, i.e., toward the panel 30. That is, the hole 42 has a shape depressed toward the panel 30 on the protruded part.

In this way, if the hole 42 is receded toward the panel 30 on the protruded parts 41*a* and 41*b*, the fastening means 43 does not easily comes out in the outside direction, thereby fastening more strongly the circuit boards 50*a* and 50*b*.

The protruded parts 41*a* and 41*b* formed in the heat radiating frame 40 according to an embodiment of the present invention is a constituent element for replacing a function of the PEM nut for fastening conventional fastening means and saves a cost of a conventional PEM nut, and a process of inserting the PEM nut may be omitted, and thus a manufacturing cost is reduced.

That is, since the heat radiating frame 40 and the circuit boards 50*a* and 50*b* are separated by a predetermined distance by the protruded parts 41*a* and 41*b* formed in the heat radiating frame 40, a space for moving heat is secured and the circuit board is fixed as the fastening means 43 is fastened toward the panel 30 through the hole 42 formed in the protruded part.

Since the circuit boards 50*a* and 50*b* positioned in the rear side of the heat radiating frame 40 have a different heating value and height, a height of each protruded part can be differently formed.

That is, since the protruded part 41*a* shown at the left side of FIGS. 4 and 5 is coupled to a circuit board 50*a* that heavily releases heat or a circuit board 50*a* having a high height of soldering side, the protruded part 41*a* has a height higher than a different protruded part 41*b* (H1>H2). Similarly, since the protruded part 41*b* shown at the right side of FIGS. 4 and 5 is coupled to a circuit board 50*b* that does not heavily release heat or a circuit board 50*b* having a low height of soldering side, the protruded part 41*b* has a height lower than the different protruded part 41*a*.

In a circuit board that heavily releases heat as in an intelligent power module (IPM) for generating a high frequency of high current through driving the switch, since the protruded part 41*a* formed in the heat radiating frame 40 has a relatively high height H1, it is preferable to secure a distance by the height H1 of the heat radiating frame 40 and the protruded part in order to solve a problem of a heating value.

Since a height of the soldering side of the circuit boards 50*a* and 50*b* is generally about 2 mm or more, it is preferable that the heights H1 and H2 of the protruded part is 3 mm or more. Furthermore, when a height of the protruded parts 41*a* and 41*b* exceeds 15 mm, an empty space for air convection is formed between the heat radiating frame 40 and the circuit boards 50*a* and 50*b* to assist the release of heat. However, due to a distance between the heat radiating frame and the circuit board, the decrease in thickness of a display apparatus can not be accomplished and due to vibration of the panel in the space, noise is generated, so that it is preferable that the heights H1 and H2 of the protruded part are 15 mm or less.

The protruded parts 41a and 41b formed in the heat radiating frame 40 according to an embodiment of the present invention may be formed to have an equal height or a height of at least one protruded part may be formed to be different from that of the remaining protruded parts considering a heating value of the coupled circuit boards.

Furthermore, a radius of a hole formed in the protruded parts 41a and 41b can be changed by a designer.

Figure 6:
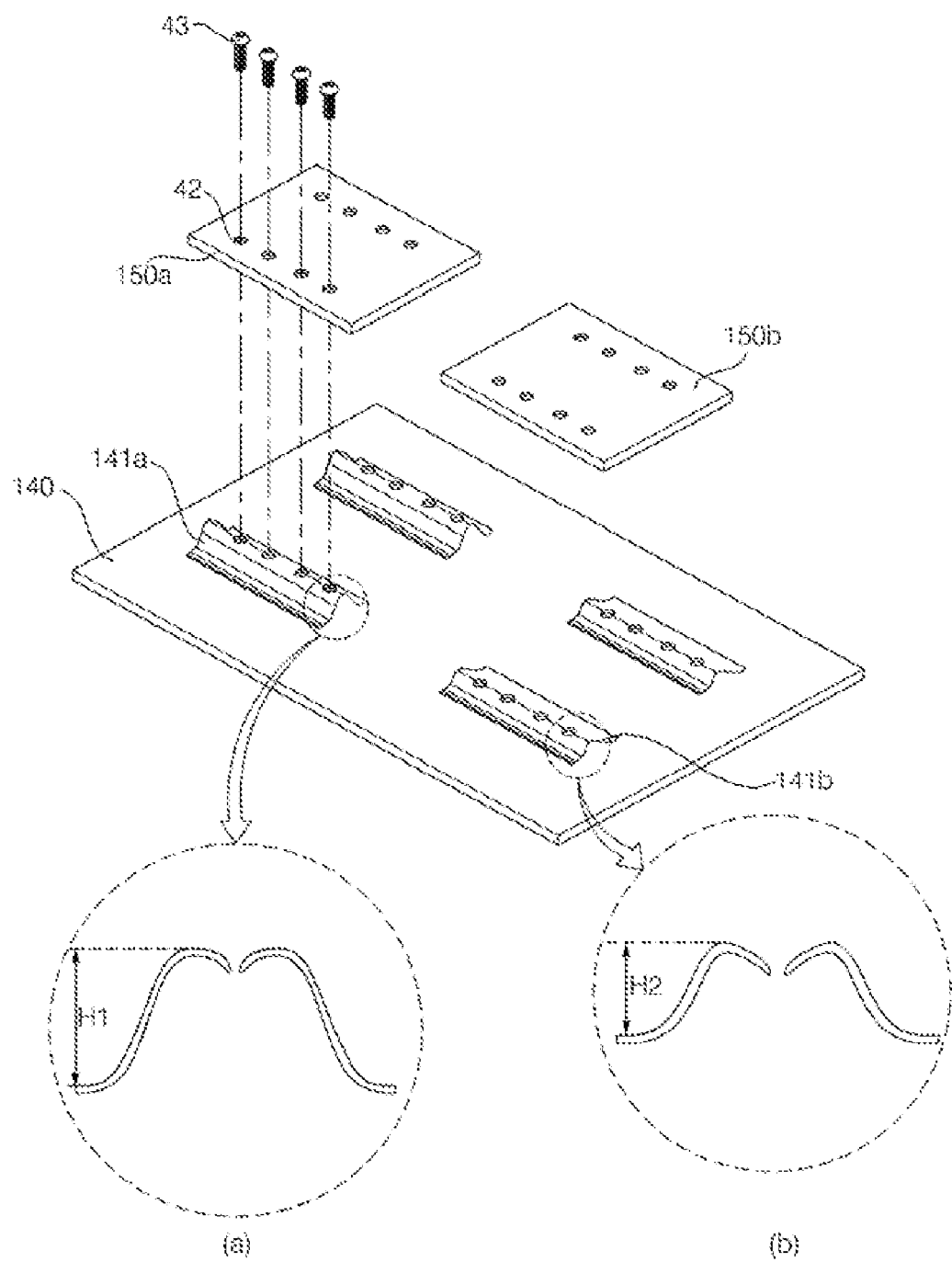
FIG. 6 is a perspective view of a heat radiating frame according to a second embodiment of the present invention.

In a heat radiating frame according to a second embodiment shown in FIG. 6, at least one protruded part is formed and a plurality of holes is formed in the protruded part.

Furthermore, as in the first embodiment, a height of any one of a plurality of protruded parts can be different from that of other protruded parts.

That is, the protruded part 141a and 141b according to the second embodiment is formed as the heat radiating frame 140 draws in a rectangular shape so as to form a plurality of holes through which a plurality of fastening means 43 is penetrated and a height H1 of the protruded part 141a coupled to a left circuit board 150a is higher than a height H2 of the protruded part 141b coupled to a right circuit board 150b.

It is preferable that the left circuit board 150a is a circuit board that heavily releases heat or a circuit board having a high height of soldering side and the right circuit board 150b is a circuit board that does not relatively heavily release heat or a circuit board having a low height of soldering side.

Figure 7:
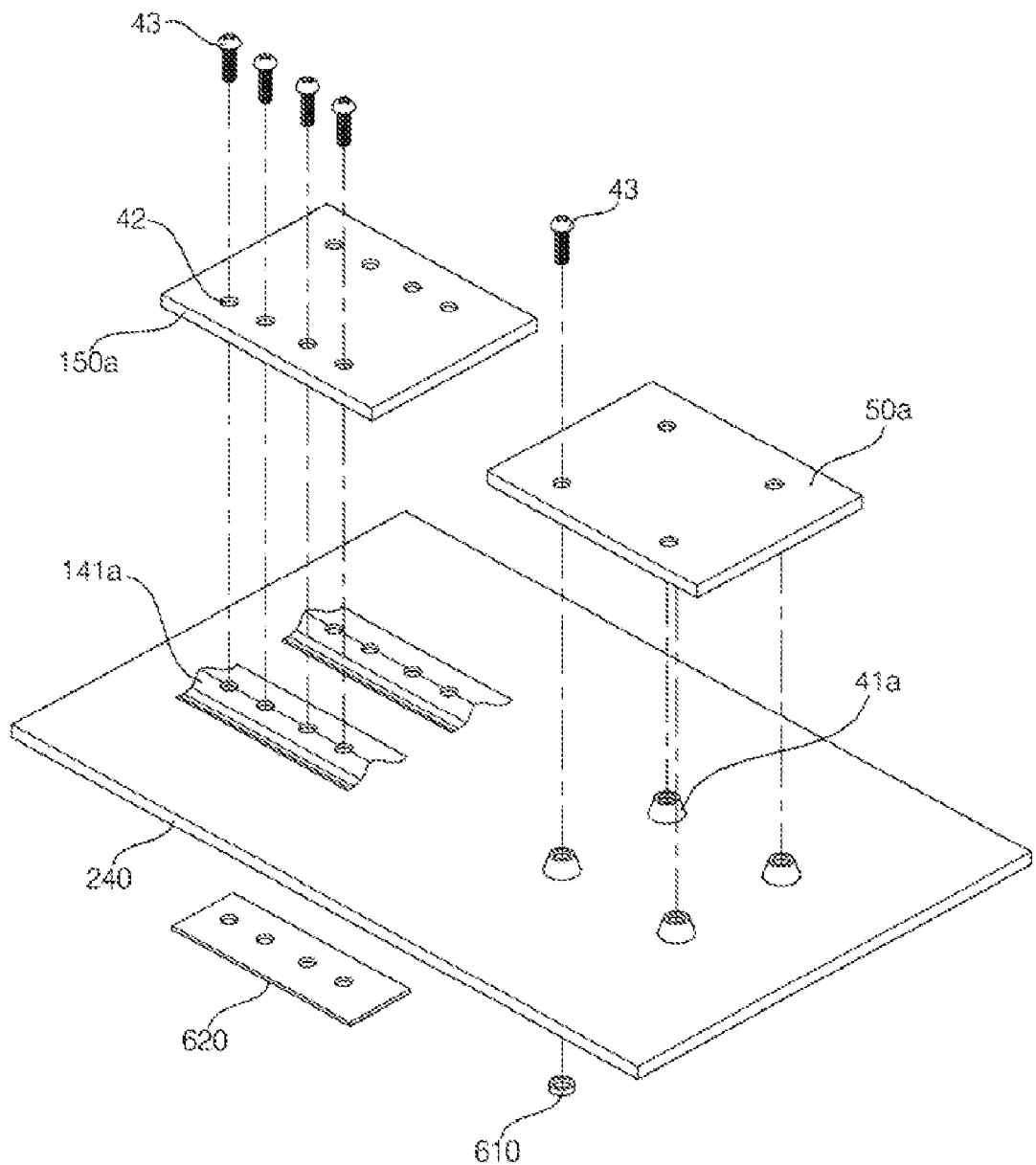
FIG. 7 is a perspective view of a heat radiating frame according to a third embodiment of the present invention.

In a heat radiating frame according to a third embodiment shown in FIG. 7, it is characterized that at least one protruded part is formed, and one hole is formed in one protruded part 41a as in the first embodiment and a plurality of holes are formed in another protruded part 141a as in the second embodiment. That is, in the third embodiment, the number of holes formed in the protruded part and a form of a fixed part corresponding thereto change.

That is, in the heat radiating frame 240 according to the third embodiment, the protruded part 41a in which one hole is formed as in the first embodiment to and a rectangular protruded part 141a having a plurality of holes is formed as in the second embodiment. Furthermore, each of the protruded parts is coupled to the circuit boards 50a and 150a.

Fastening means 43 for penetrating holes formed in the circuit boards 50a and 150a and the protruded part 41a and 141a is coupled to the holes of each of fixed parts 610 and 620 and holes corresponding to the number of the holes formed in the protruded part are formed in the fixed part. Therefore, a single hole is formed in a fixed part 610 corresponding to the protruded part 41a in which a single hole is formed according to the first embodiment, and a plurality of holes is formed in a fixed part 620 corresponding to the protruded part 141a in which a plurality of holes is formed according to the second embodiment.

At least one hole for fixing the fastening means 43 that penetrates the circuit boards 50a and 150a and the protruded parts 41a and 141a is formed in the fixed parts 610 and 620, and the fixed parts 610 and 620 are positioned between the panel 30 and the heat radiating frame 240.

Figure 8:
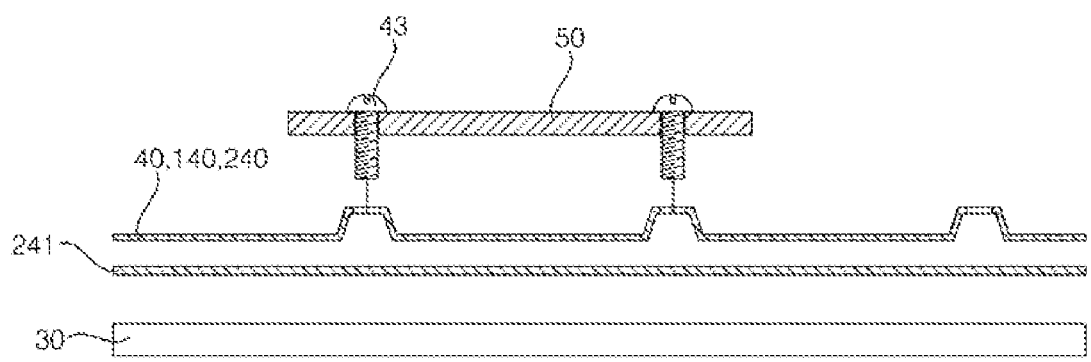
FIG. 8 is a cross-sectional view of a heat radiating frame according to a fourth embodiment of the present invention.

In a fourth embodiment shown in FIG. 8, first heat radiating frames 40, 140, and 240 in which at least one protruded part 41a and 141a is formed in any one side and a second heat radiating frame 241 adjacently coupled to the first heat radiating frame so as to increase heat radiating efficiency are provided, and the second heat radiating frame 241 may be a flat frame type.

That is, in a fourth embodiment, the first heat radiating frames 40, 140, and 240 are coupled to the circuit board 50 to emit heat and the second heat radiating frame 241 is coupled to the panel 30 to emit heat, thereby improving heat radiating efficiency.

The remaining construction in the fourth embodiment is equal to that in the above embodiments and thus description thereof will be omitted.

Figure 9:
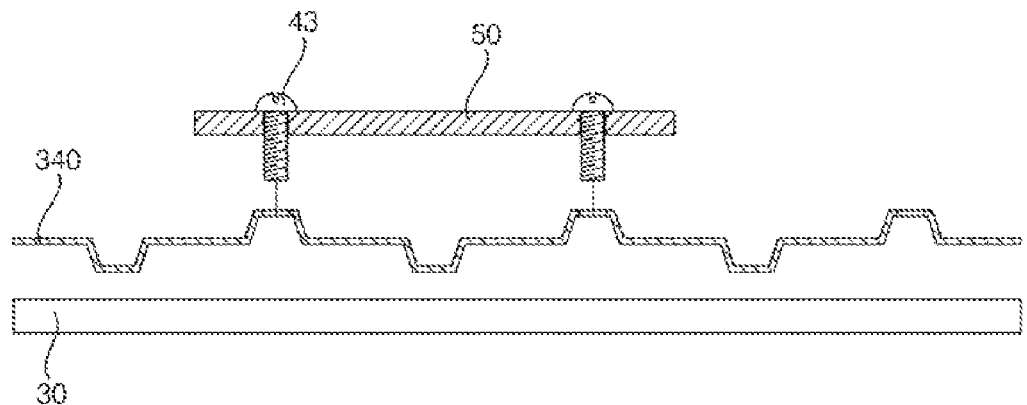
FIG. 9 is a cross-sectional view of a heat radiating frame according to a fifth embodiment of the present invention.

It is characterized that at least one protruded part 41a and 141a is formed in each of both surfaces of the heat radiating frame 340 of a fifth embodiment shown in FIG. 9. One hole may be formed in the protruded part as in the first embodiment and a plurality of holes may be formed as in the second embodiment.

Furthermore, when the hole is formed in a protruded part protruded on one surface (top surface in the drawings) of a heat radiating frame to which the circuit board 50 is coupled, the fastening means 43 is coupled through the hole, thereby fixing the circuit board.

In a case where the hole is formed in each of both protruded parts of the heat radiating frame 340, a structure of both surfaces in the heat radiating frame becomes equal and thus both frames can be used in an assembly process without dividing an upper surface and a lower surface.

It is characterized that in the fifth embodiment, the protruded part of the heat radiating frame 340 is formed in both directions, and the remaining construction in the fifth embodiment is equal to that in the above embodiments and thus description thereof will be omitted.

Figure 10:
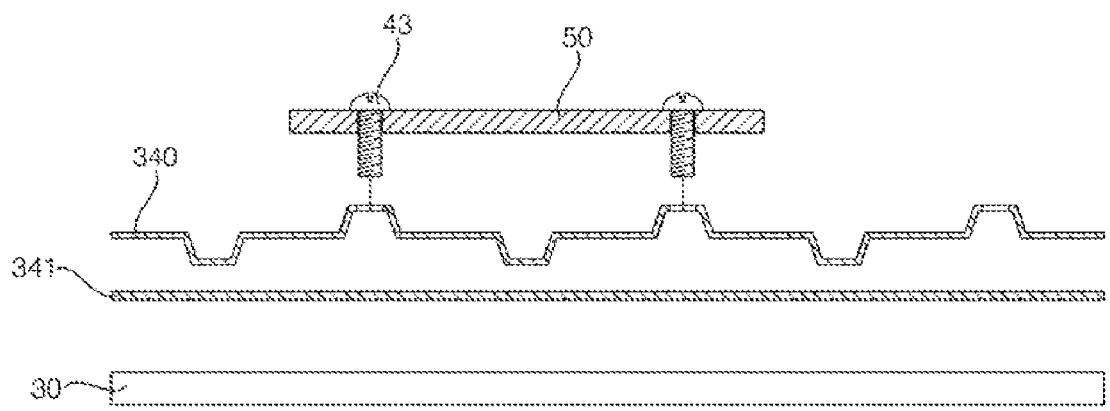
FIG. 10 is a cross-sectional view of a heat radiating frame according to a sixth embodiment of the present invention.

In a sixth embodiment shown in FIG. 10, a first heat radiating frame 340 in which at least one protruded part 41a and 141a is formed in each of both surfaces and a second heat radiating frame 341 adjacently coupled to the first heat radiating frame 340 so as to increase heat radiating efficiency are provided, and the second heat radiating frame 341 may be a flat frame type.

That is, in the sixth embodiment, a structure in which at least two heat radiating frames constitute a layer is provided as in the fourth embodiment and protruded parts are formed in each of both surfaces of the first heat radiating frame 340 coupled to the circuit board 50 as in the fifth embodiment.

The remaining construction in the sixth embodiment is equal to that in the above embodiments and thus description thereof will be omitted.

Figure 11:
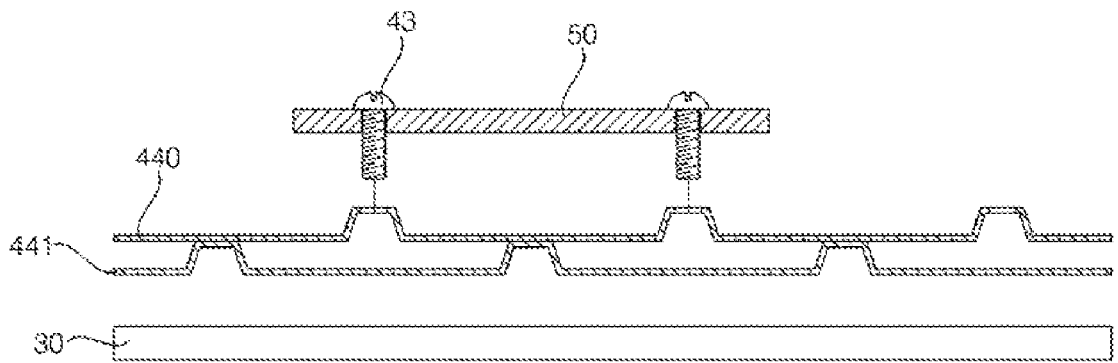
FIG. 11 is a cross-sectional view of a heat radiating frame according to a seventh embodiment of the present invention.

In a seventh embodiment shown in FIG. 11, heat radiating frames 440 and 441 in which at least one protruded part 41a and 141a is formed in any one surface are stacked with at least two layers and it is characterized that the second heat radiating frame of the fourth embodiment is not a flat type and that a protruded part is formed in only one surface similarly to the first heat radiating frame.

That is, the circuit board 50 is fixed apart by a predetermined height by a protruded part formed in the first heat radiating frame 440 and the second heat radiating frame 441 is coupled apart by a predetermined height from the first heat radiating frame 440 by the protruded part.

Figure 15:
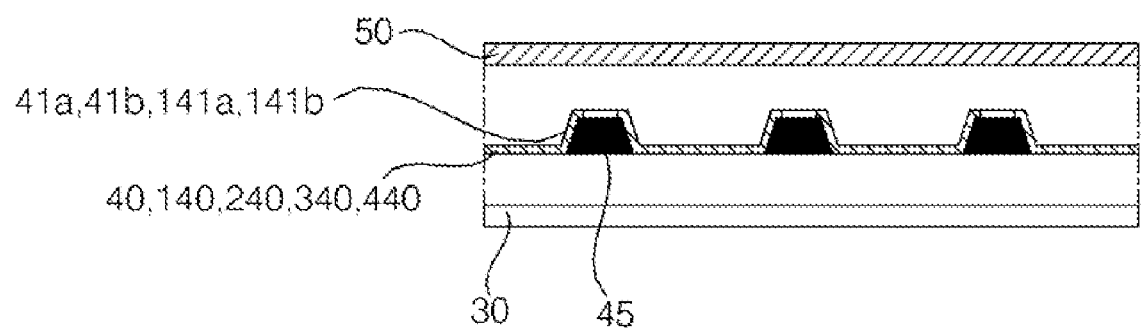
FIG. 15 is a cross-sectional view of a heat radiating frame that is filled with a sound absorbing material according to an embodiment of the present invention.

Because the second heat radiating frame 441 is not a flat type, an entire surface thereof forms a space by a protruded part without being coupled to the panel, and the space can be filled with a sound absorbing material as shown in FIG. 15.

Figure 12:
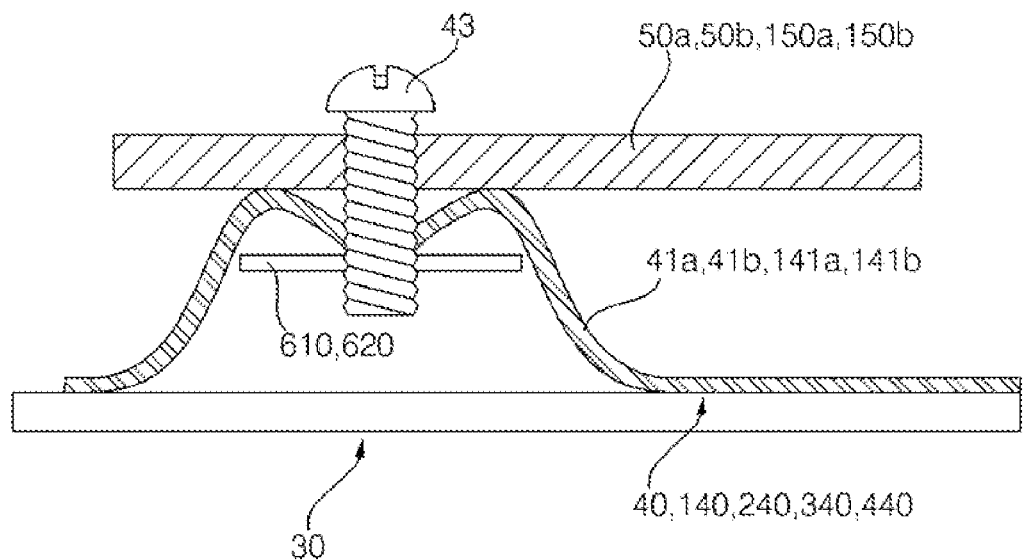
FIG. 12 is a view illustrating a first fastening structure of a heat radiating frame according to the first to seventh embodiments of the present invention.
Figure 13:
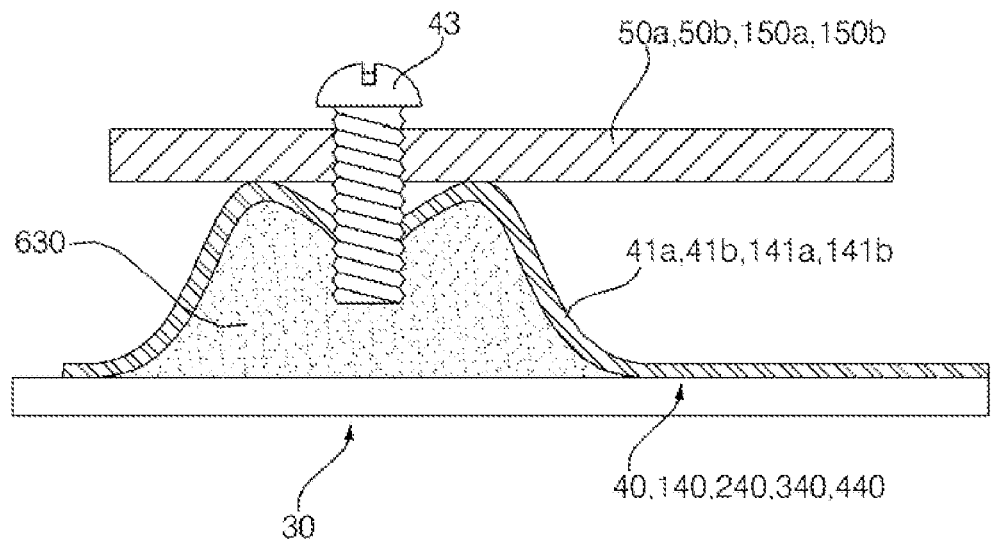
FIG. 13 is a view illustrating a second fastening structure of a heat radiating frame according to the first to seventh embodiments of the present invention.

In the heat radiating frame according to the first to the seventh embodiments of the present invention, fixed parts 610 and 620 for fixing fastening means that penetrates the hole of the protruded part are provided, and the fixed parts have a section as in FIGS. 12 and 13.

First, the fixed parts 610 and 620 shown in FIG. 12 have a bar shape of a metal material and have a hole through which the fastening means 43 is penetrated.

Furthermore, the fixed part 630 can be replaced with a material, which is not a separate component and the fastening means 43 can be fixed by inserting a predetermined material into a space within the protruded parts 41a, 41b, 141a, and 141b formed in the heat radiating frame, that is, a space apart from the panel 30 as shown in FIG. 13.

It is preferable that a material forming the fixed part 630 of the above form has liquidity so as to fill the space and has hardening characteristics so that the fastening means 43 may be fixed without swing after being inserted.

For example, a silicone material can be used as a liquidity material forming the fixed part 630 and has strength to prevent the fastening means 43 from coming out to the outside after the fastening means 43 is inserted into a space between the liquidity materials.

Figure 14A:
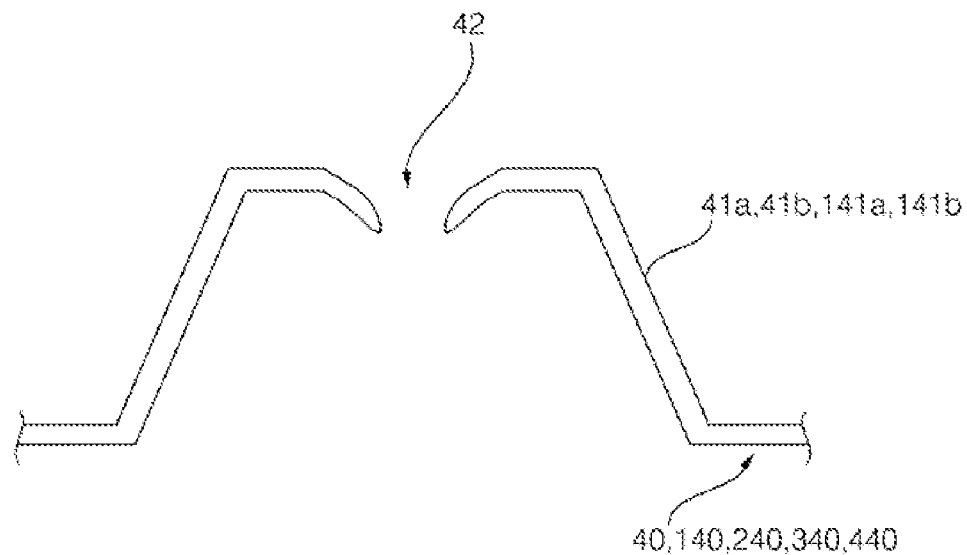
FIG. 14 are views illustrating other shapes of a protruded part.
Figure 14B:
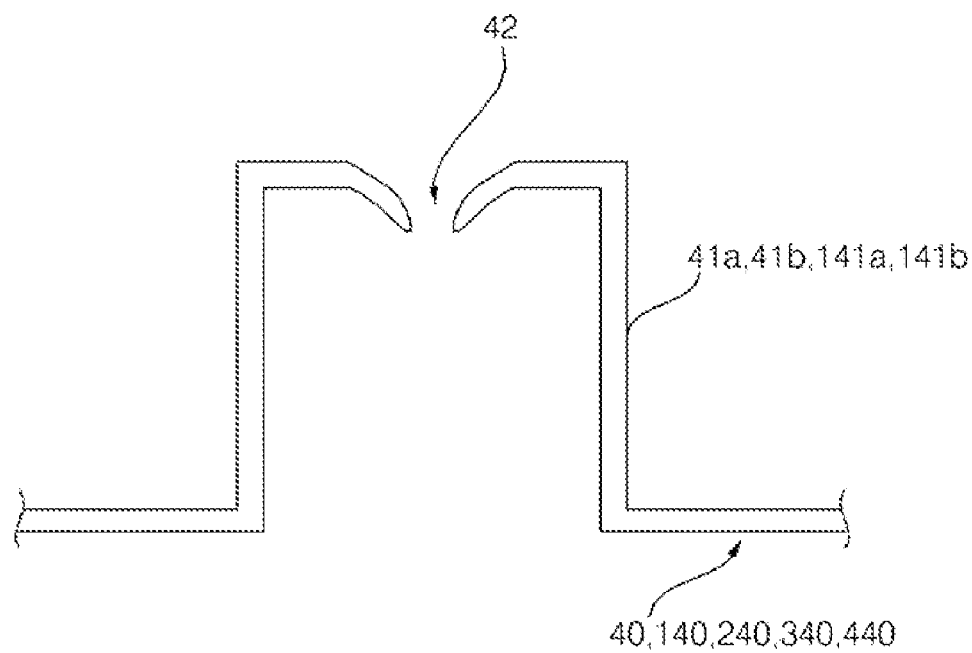

The above embodiments show a case where a section of the protruded parts 41a, 41b, 141a, and 141b has a bell shape, but the section may have various shapes such as a trapezoidal shape and a quadrilateral shape, as shown in FIGS. 14a and 14b.

The protruded parts 41a, 41b, 141a, and 141b shown in FIG. 14a may have a section of a trapezoidal shape in which a length of a base is longer than that of an upper base, and at least hole 42 is formed in the protruded parts.

The protruded parts 41a, 41b, 141a, and 141b shown in FIG. 14b may have a section of a quadrangular shape in which a length of a base is equal to that of an upper base, and at least hole 42 is formed in the protruded parts.

A shape of a section of the protruded parts 41a, 41b, 141a, and 141b is determined by an equipment and a pressing technology for drawing the heat radiating frame 40, 140, 240, 340, and 440.

FIG. 15 schematically illustrates a section of the heat radiating frames 40, 140, 240, 340, and 440 in which the protruded parts 41a, 41b, 141a, and 141b are formed. A space between the heat radiating frame and the panel 30 is a space for generating air convection so as to radiate heat and is a space in which noise generates due to vibration generating when driving the panel.

Therefore, as shown in FIG. 15, in an embodiment of the present invention, the sound absorbing material 45 is filled in a space between any one protruded part and another protruded part adjacent thereto, i.e., a space apart from each other.

The sound absorbing material 45 is a material for absorbing noise and vibration and may use at least one of carpet, glass wool, rock wool, acetate, cotton, glass fiber, and felt.

Furthermore, it is preferable that the sound absorbing material 45 does not fill an entire space but fill a partial space of a panel edge in which vibration noise generally generates.

In an image display apparatus according to an embodiment of the present invention, a conventional PEM nut is replaced with the protruded part formed by drawing the heat radiating frame, and a circuit board is disposed on the protruded part, so that a manufacturing process is simplified and a manufacturing cost is reduced.

The fastening means for fixing a circuit board by penetrating the protruded part is securely fixed by the fixed part.

Furthermore, as the protruded part is formed on one surface of the heat radiating frame, a space between the heat radiating frame and the circuit board is secured and as the protruded part is formed on both surfaces of the heat radiating frame, a space between the heat radiating frame and the panel is also secured. Since the heat radiating frame can be stacked with two layers, heat radiating efficiency is improved.

Furthermore, it is possible to solve a noise problem due to panel vibration by filling a sound absorbing material in a space i.e., a separating space in which the heat radiating frame does not coupled to the panel due to the protruded part formed in the heat radiating frame.

The embodiment of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image display apparatus comprising:
   a panel;
   at least one heat radiating frame that is positioned at the rear side of the panel; and
   at least one circuit board that is positioned at the rear side of the heat radiating frame,
   wherein at least one protruded part is provided in one surface or both surfaces of a first heat radiating frame opposite to the circuit hoard and at least one hole that penetrates fastening means for fastening the circuit board is formed in the protruded part,
   wherein the protruded part formed in the first heat radiating frame is formed by drawing the frame toward the circuit board, and
   wherein a second heat radiating frame is stacked between the first heat radiating frame and the panel, and at least one protruded part drawn toward the first heat radiating frame is formed in the second heat radiating frame.

2. The image display apparatus of claim 1, wherein a fixed part for fixing the fastening means is inserted between the protruded part and the panel.

3. The image display apparatus of claim 1, wherein the protruded part is formed in plural, and
   a height of at least one of the plurality of protruded parts is different from that of the remaining protruded parts.

4. The image display apparatus of claim 1, wherein a height of the protruded part ranges 3 mm to 15 mm.

5. The image display apparatus of claim 1, wherein the protruded part has a trapezoidal section.

6. The image display apparatus of claim 1, wherein the protruded part has a rectangular section.

7. The image display apparatus of claim 1, wherein the protruded pan has a bell-shaped section.

8. The image display apparatus of claim 1, wherein the hole is receded in a coupling direction of the panel on the protruded part.

9. The image display apparatus of claim 1, wherein a sound absorbing material is filled within the protruded part opposite to the panel.

10. The image display apparatus of claim 2, wherein at least one hole for penetrating the fastening means is formed in the fixed part.

11. The image display apparatus of claim 2, wherein the fixed part is a plate in which at least one hole is formed.

12. The image display apparatus of claim 2, wherein the fixed part is a silicone material inserted into a protruded pan so as to fix the fastening means fastened to the protruded part.

13. The image display apparatus of claim 1, wherein a second heat radiating frame is stacked between the first heat radiating frame and the panel, and
   the second heat radiating frame is a flat type.

14. An image display apparatus comprising:

a panel;

at least one heat radiating frame that is positioned at the rear side of the panel; and at least one circuit board that is positioned at the rear side of the heat radiating frame, wherein at least one protruded part is provided in one surface or both surfaces of a first heat radiating frame opposite to the circuit board and at least one hole that penetrates fastening means for fastening the circuit board is formed in the protruded part, wherein at least one protruded part is formed in each of both surfaces of the first heat radiating frame by drawing.

15. The image display apparatus of claim 14, wherein a second heat radiating frame is stacked between the first heat radiating frame and the panel, and the second heat radiating frame is a flat type.

* * * * *